United States Patent
Min et al.

(10) Patent No.: US 7,517,757 B2
(45) Date of Patent: Apr. 14, 2009

(54) NON-VOLATILE MEMORY DEVICE HAVING DUAL GATE AND METHOD OF FORMING THE SAME

(75) Inventors: Hong-Kook Min, SungNam-shi (KR); Hee-Seong Jeon, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 47 days.

(21) Appl. No.: 11/684,237

(22) Filed: Mar. 9, 2007

(65) Prior Publication Data

US 2007/0166908 A1 Jul. 19, 2007

Related U.S. Application Data

(62) Division of application No. 10/726,911, filed on Dec. 3, 2003, now Pat. No. 7,259,423.

(30) Foreign Application Priority Data

Jan. 24, 2003 (KR) ................ 2003-04804

(51) Int. Cl.
H01L 21/336 (2006.01)

(52) U.S. Cl. ............... 438/261; 438/267; 438/288; 438/304; 438/737; 257/E21.679

(58) Field of Classification Search ................ 438/257, 438/288, 305, 595, 261, 267, 304, 737; 257/E21.679
See application file for complete search history.

(56) References Cited

U.S. PATENT DOCUMENTS

| 6,927,133 | B2 * | 8/2005 | Takahashi | 438/267 |
| 7,341,912 | B2 * | 3/2008 | Choi et al. | 438/257 |
| 2002/0041526 | A1 * | 4/2002 | Sugita et al. | 365/200 |
| 2005/0176202 | A1 * | 8/2005 | Hisamoto et al. | 438/257 |

* cited by examiner

*Primary Examiner*—M. Wilczewski
*Assistant Examiner*—Toniae M Thomas
(74) *Attorney, Agent, or Firm*—F. Chau & Associates, LLC

(57) ABSTRACT

A non-volatile memory device including a control gate pattern having a tunnel insulation pattern, a trap-insulation pattern, a blocking insulation pattern and a control gate electrode, which are stacked on a semiconductor substrate. A selection gate pattern is disposed on the semiconductor substrate at one side of the control gate pattern. A gate insulation pattern is interposed between the selection gate electrode and the semiconductor substrate, and between the selection gate electrode and the control gate pattern. A cell channel region includes a first channel region defined in the semiconductor substrate under the selection gate electrode and a second channel region defined in the semiconductor substrate under the control gate electrode.

20 Claims, 9 Drawing Sheets (RELEVANT ART)

NON-VOLATILE MEMORY DEVICE HAVING DUAL GATE AND METHOD OF FORMING THE SAME

CROSS-REFERENCE TO RELATED APPLICATIONS

This application is a divisional of application Ser. No. 10/726,911, filed on Dec. 3, 2003 now U.S. Pat. No. 7,259,423, which claims priority to Korean Patent Application No. 2003-04804, filed on Jan. 24, 2003, the disclosure of which are incorporated herein by reference in their entirely.

BACKGROUND

1. Technical Field

The present disclosure relates to a semiconductor memory device, more particularly, to a non-volatile memory device having a dual gate and a method of forming the same.

2. Disclosure of Related Art

Semiconductor memory devices may be classified into volatile memory devices and non-volatile memory devices. A volatile memory device loses stored data when power to the device is cut off. DRAM devices and SRAM devices are examples of volatile memory devices. A non-volatile memory device maintains stored data even when power to the device is cut off. A flash memory device is an example of a non-volatile memory device.

In a conventional flash memory cell, electric charges in the form of free carriers are stored within an isolated floating gate. Silicon-Oxide-Silicon (SONOS) memory devices, which store electric charges within a deep level trap, have also been investigated.

SONOS memory devices are non-volatile memory devices. A flash memory cell may lose all electric charges if a part of a tunnel oxide suffers from defects because electric charges are stored in the form of free carriers. To the contrary, a SONOS memory device maintains electric charges even if a part of the tunnel oxide suffers from defects because electric charges are stored in an isolated deep level trap. Accordingly, the tunnel oxide of SONOS memory devices can be formed thinner than that of flash memory devices having a floating gate. Consequently, it is possible for SONOS memory devices to operate with low voltage as compared with flash memory devices having a floating gate. There are two conventional methods of storing data in SONOS memory devices. These methods are the Fowler-Nordheim tunneling (FN tunneling) method and the hot carrier injection method.

A SONOS memory cell is disclosed in U.S. Pat. No. 5,768,192 entitled Non-volatile Semiconductor Memory Cell Utilizing Asymmetrical Charge Trapping, issued to Eitan et al. A program operation for a conventional SONOS memory cell is explained below with reference to FIG. 1.

Referring to FIG. 1, a first silicon oxide layer '2', a silicon nitride layer '3', a second silicon oxide layer '4' and a gate electrode '5' are sequentially stacked on a semiconductor substrate '1'. Source region '6' is formed at one side of the gate electrode '5' and drain region '6a' is formed at another side of the gate electrode '5' in the semiconductor substrate '1'.

According to the operation of the SONOS memory cell having the above structure, programming voltage is applied to the gate electrode '5' and drain voltage is applied to the drain region '6a'. Ground voltage is applied to the source region '6'. Accordingly, hot carrier injection occurs at portions neighboring the drain region '6a'. Consequently, electronic charges are stored at a predetermined region of the silicon nitride layer '3', so that charging region 'k' is formed. The charging region 'k' is adjacent to the drain region '6a'.

In the conventional SONOS memory cell, the distance between the source region '6' and drain region '6a' may be shortened to accommodate high integration of a semiconductor device. Accordingly, punch through between drain/source regions '6' and '6a' may take place during program operation. Thus, SONOS memory cells have not been widely used because of their inability to be highly integrated.

SUMMARY OF THE INVENTION

A non-volatile memory cell according to an embodiment of the invention includes a control gate pattern including a tunnel insulation pattern, a trap insulation pattern, a blocking insulation pattern and a control gate electrode, which are stacked over a semiconductor substrate. A selection gate electrode is disposed over the semiconductor substrate at one side at the control gate pattern. A gate insulation pattern is interposed between the selection gate electrode and the semiconductor substrate, and between the selection gate electrode and the control gate pattern. A cell channel region including a first channel region is defined in the semiconductor substrate under the selection gate electrode and a second channel region is defined in the semiconductor substrate under the control gate electrode.

The selection gate electrode may be spacer-shaped and elongated to cover one sidewall and a top surface of the control gate pattern and a top surface of the control gate pattern. The device may be further include drain/source regions formed in the semiconductor substrate at respective sides of the cell channel region. The drain region may be in contact with the first channel region and the source region may be in contact with the second channel region.

A non-volatile memory cell according to another embodiment of the invention includes a first control gate pattern and a second control gate pattern disposed in parallel over a semiconductor substrate, each of the first and second control gate patterns including a tunnel insulation pattern, a trap insulation pattern, a blocking insulation layer and a control gate electrode which are stacked sequentially. The first selection gate electrode is disposed over the semiconductor substrate at one side of the first control gate pattern. The second selection gate electrode is disposed over the semiconductor substrate at one side of the second control gate pattern. The first gate insulation pattern is interposed between the first selection gate electrode and the semiconductor substrate, and between the first selection gate electrode and the first control gate pattern. The second gate insulation pattern is interposed between the second selection gate electrode and the semiconductor substrate, and between the second selection gate electrode and the second control gate pattern. A first cell channel region includes a first channel region defined in the semiconductor substrate under the first control gate pattern and a second channel region defined in the semiconductor substrate under the selection gate electrode. A second cell channel region includes a first channel region defined in the semiconductor substrate under the second control gate pattern and a second channel region defined in the semiconductor substrate under the second selection gate electrode. The first and second selection gate electrodes are disposed symmetrically over the substrate.

The first selection gate electrode may be spacer-shaped and elongated to cover one sidewall and a top surface of the first control gate electrode and one sidewall of the first selection gate electrode. The second selection gate electrode may be spacer-shaped and elongated to cover one sidewall and a top surface of the second control gate electrode and one sidewall of the second selection gate electrode. The selection gate electrodes are disposed between the control gate patterns. In at least one other embodiment, the control gate patterns may be disposed between the selection gate electrodes.

A method of fabricating a non-volatile memory cell according to an embodiment of the invention includes a step of forming a tunnel insulation layer, a trap insulation layer, a blocking insulation layer, a first gate conductive layer and a hard mask layer sequentially over a semiconductor substrate. A stepped groove exposing a predetermined region of the semiconductor substrate is formed by patterning the hard mask layer, the first gate conductive layer, the trap insulation layer and the blocking insulation layer, wherein the tunnel insulation layer, the trap insulation layer, the blocking insulation layer and the first gate conductive layer form protruding portions of the stepped groove. A spacer-shaped selection gate electrode covering the protruding portions of the stepped groove are formed. A gate insulation pattern is formed between the selection gate electrode and an inner sidewall of the stepped groove, and between the selection gate electrode and the semiconductor substrate. A control gate pattern is formed having a sidewall self-aligned with a sidewall of the gate insulation pattern. The control gate pattern includes the tunnel insulation pattern, the trap insulation pattern, the blocking insulation pattern and the control gate electrode, which are stacked sequentially.

A method of fabricating a non-volatile memory cell according to another embodiment of the present invention includes a step of forming a tunnel insulation layer, a trap insulation layer, a first gate conductive layer and a hard mask layer sequentially over a semiconductor substrate. A line pattern, which includes a preliminary tunnel insulation pattern, a preliminary trap insulation pattern, a preliminary blocking insulation pattern, a first gate conductive pattern and a hard mask pattern which are stacked sequentially, is formed by patterning the hard mask layer, the first gate conductive layer, the blocking insulation layer, the trap insulation layer and the tunnel insulation layer sequentially. The first gate conductive pattern, the preliminary blocking insulation pattern, the preliminary trap insulation pattern and the preliminary tunnel insulation pattern form protruding portions of the line pattern. A spacer-shaped selection gate electrode is formed that covers the protruding portion of the line pattern. A gate insulation pattern is formed between the selection gate electrode and the line pattern, and between the selection gate electrode and the semiconductor substrate. A control gate pattern is formed having a sidewall self-aligned with the gate insulation pattern. The control gate pattern includes a tunnel insulation pattern, a trap insulation pattern, a blocking insulation pattern and a control gate electrode, which are stacked sequentially.

BRIEF DESCRIPTION OF THE DRAWINGS

Embodiments of the invention will be described with reference to the accompanying drawings in which.

DESCRIPTION OF PREFERRED EMBODIMENTS

Figure 1:
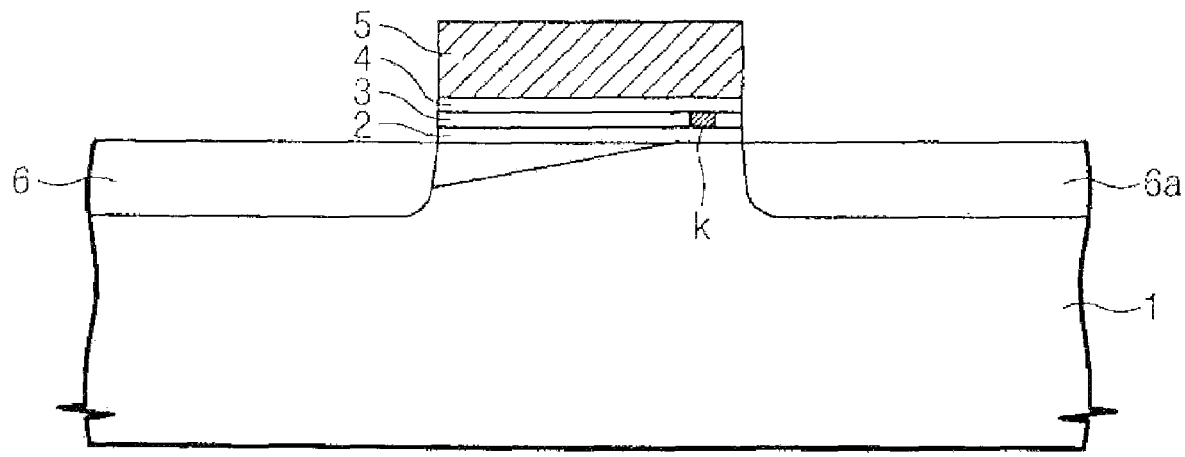
FIG. 1 is a cross-sectional view of a SONOS memory cell according to the conventional art.

Preferred embodiments of the invention will now be described more fully hereinafter with reference to the accompanying drawings. In the drawings, the thickness of the layers and regions are exaggerated for clarity. Like numbers refer to like elements throughout the specification.

Figure 2:
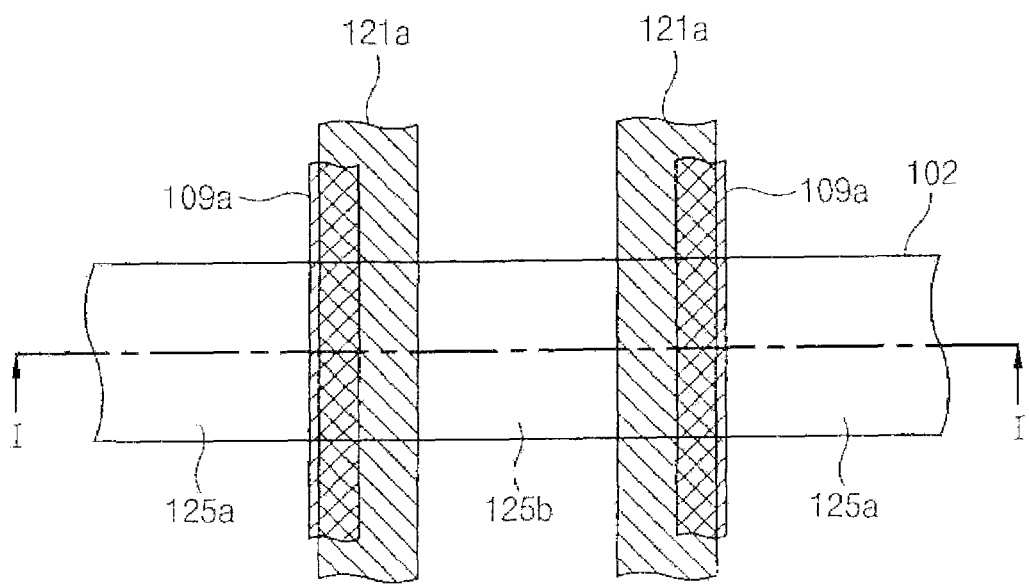
FIG. 2 is a top plan view of a non-volatile memory cell according to an exemplary embodiment of the present invention.
Figure 3:
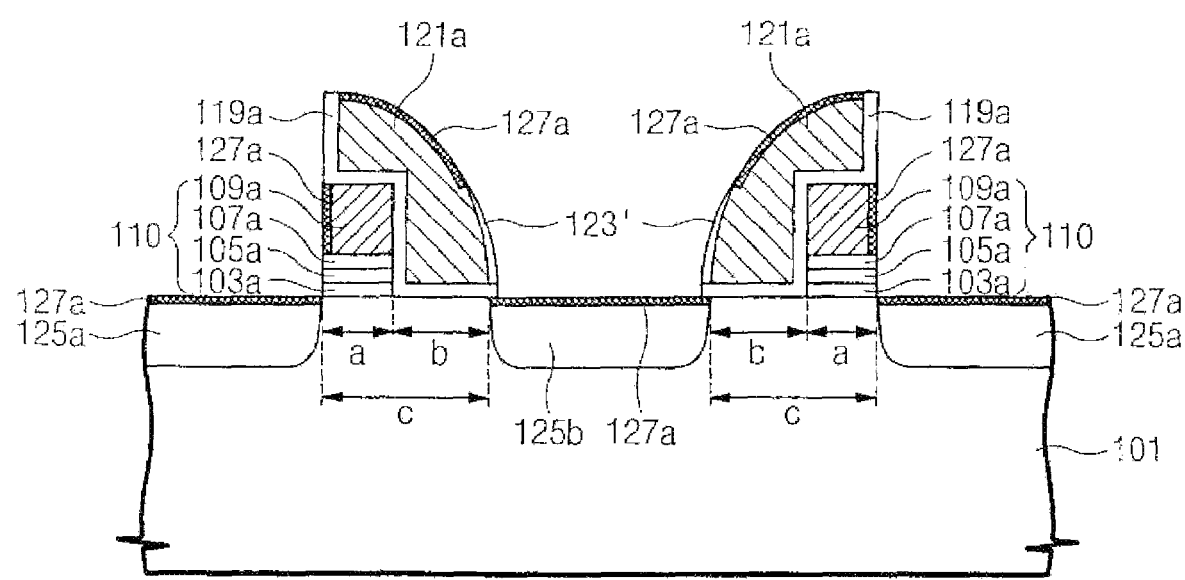
FIG. 3 is cross-sectional view, as taken through line I-I' in FIG. 2.
Figure 4:
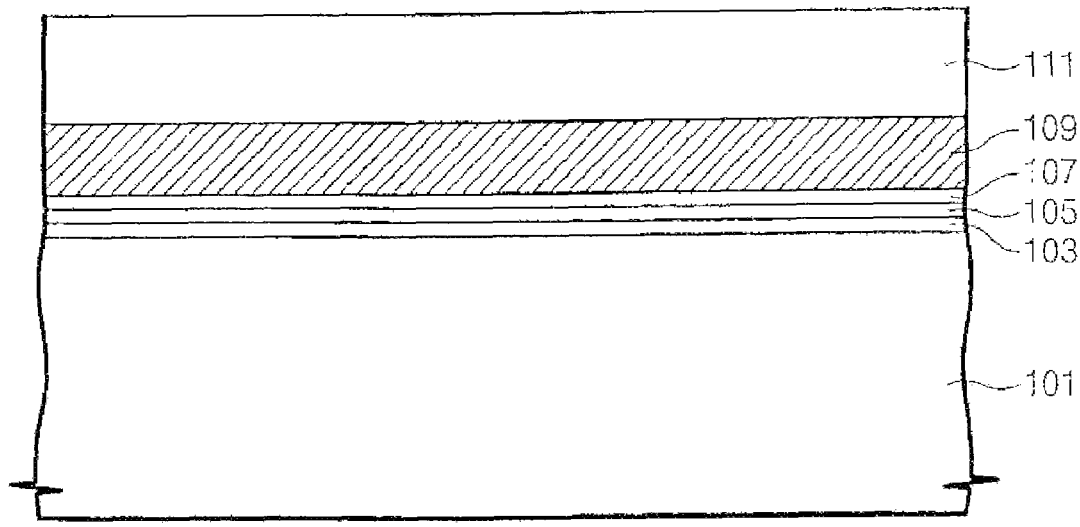
FIG. 4 through FIG. 10 is cross-sectional views showing a method of forming a non-volatile memory cell according to an exemplary embodiment of the invention.

FIG. 2 is a top plan view of a floating trap-type non-volatile memory cell according to an embodiment of the present invention and FIG. 3 is a cross-sectional view, as taken through line I-I' in FIG. 2.

Referring to FIG. 2 and FIG. 3, an active region 102 is disposed in a predetermined region of a semiconductor substrate 101. The active region 102 is defined by a device isolation layer formed in the semiconductor substrate 101. A couple of control gate patterns 110 cross over the active region 102 in parallel. The control gate pattern 110 includes a tunnel insulation pattern 103a, a trap insulation pattern 105a, a blocking insulation pattern 107a and a control gate electrode 109a, which are stacked sequentially. The tunnel insulation pattern 103a may be formed of, for example, silicon oxide or silicon oxynitride. The trap insulation pattern 105a stores data. Charges of the active region 102 are stored in traps within the trap insulation pattern 105a by tunneling through the tunnel insulation pattern 103a or the stored charges within the trap insulation pattern 105a discharged into the active region 102 by tunneling through the tunnel insulation pattern 103a. In this regard, data may be stored or removed. The trap insulation layer pattern 105a includes an insulation layer having high-trap-density. For example, the trap insulation pattern 105a may be formed of at least one selected from the group consisting of silicon nitride, poly-Si dots layer and nitride dots layer. The traps may be disposed in dots.

The blocking insulation pattern 107a prevents charges in the trap insulation pattern 105a from flowing into the control gate electrode 109a and charges in the control gate electrode 109a from flowing into the trap insulation layer 105a. The blocking insulation pattern 107a is preferably formed of an insulation layer, such as, for example, a silicon oxide layer. Programming or erasing voltage is applied to the control gate electrode 109a during a programming or an erasing operation. The control gate electrode 109a is preferably formed of a conductive layer, such as, for example, a doped poly-Si layer.

A selection gate electrode 121a crosses over the active region 102 on one side of the control gate pattern 110. The selection gate electrode 121a is parallel to the control gate pattern 110. The selection gate electrode 121a forms a spacer-shaped wrapping on one sidewall and top surface of the control gate pattern 110. The other lateral wall of the control gate pattern 110 is exposed. The selection gate electrode 121a includes a curved sidewall and a plane sidewall, and a concave region is disposed in a lower portion of the plane sidewall. The control gate pattern 110 is disposed in the concave region. The curved sidewalls of each respective gate electrode 121a face each other.

A gate insulation pattern 119a is interposed between the selection gate electrode 121a and the control gate pattern 110, and the selection gate electrode 121a and the semiconductor substrate 101. The gate insulation pattern 119a may be elongated to cover the entire plane sidewall of the selection gate electrode 119a on the control gate pattern 110. In this case, the exposed sidewall of the control gate pattern 110 and the portion of the gate insulation pattern 119a disposed on the control gate pattern 110 may be disposed on the same vertical line.

The thickness of the gate insulation pattern 119a interposed between the active region 102 and the select gate electrode 121a is thinner than the sum of the thickness of the insulation patterns 103a, 105a and 107a interposed between the control gate electrode 109a and the active region 102.

The selection gate electrode 121a is formed of a conductive layer, such as, for example, a doped poly-Si layer. The gate insulation pattern 119a may be formed of silicon oxide, specifically, CVD silicon oxide or thermal hardened CVD silicon oxide.

A first channel region 'a' is defined in the active region 102 under the control gate electrode 109a, and a second channel region 'b' is defined in the active region 102 under selection gate electrode 121a disposed at one side of the control gate electrode 109a. The first and second channel regions 'a' and 'b' are disposed horizontally. The first channel region 'a' is equivalent to a channel region of the control gate electrode 109a, and the second channel region 'b' is equivalent to a channel region of the selection gate electrode 121a. The first and second channel regions 'a' and 'b' compose a cell channel region 'c'.

Drain region 125a is disposed at one side of the channel region 'c' and source region 125b is disposed at another side of the channel region 'c' in the active region 102. The drain region 125a is in contact with the first channel region 'a', and the source region 125b is in contact with the second channel region 'b'.

A non-volatile memory cell according to an embodiment of the invention includes the cell channel region c, the drain/source regions 125a and 125b, the selection gate electrode 121a, the gate insulation pattern 119a and the control gate pattern 110. A couple of non-volatile memory cells are shown in FIG. 3. The source region 125b may be common source region in contact with a couple of second channel regions 'b'.

A metal silicide layer 127a may be disposed on a predetermined region of the curved sidewall of the selection gate electrode 121a, on the source/drain regions 125a and 125b and on the exposed sidewall surface of the control gate electrode 109a. The metal silicide layer 127a may be formed of at least one selected from the group consisting of cobalt silicide, titanium silicide and nickel silicide.

A residual protection layer 123' may be disposed on a lower portion of the curved sidewall of the selection gate electrode 121a. The metal silicide layer 127a may be formed only on a part of the curved sidewall in which the residual protection layer 123' is not formed. The protection layer 123' may be formed of, for example, silicon oxide. In other embodiments of the invention, the residual protection layer 123' may be omitted. If the residual protection layer 123' is omitted, the metal silicide layer may be disposed on the entire surface of the curved sidewall of the selection gate electrode 121a. The metal silicide layer 127a reduces surface resistance of the control gate electrode 109a, the selection gate electrode 121a and the drain/source region 125a and 125b.

In a method of programming a non-volatile memory cell according to an embodiment of the invention, a selection voltage is applied to the selection gate electrode 121a, and a program voltage is applied to the control gate electrode 109a. A reference voltage (e.g., ground voltage) is applied to the source region 125b, and a drain voltage is applied to the drain region 125a. Hot carriers occur at the first channel region 'a' adjacent to the drain region 125a, so that electrons are stored in traps within the trap insulation pattern 105a.

In a method of erasing a non-volatile memory cell according to an embodiment of the invention, a reference voltage (e.g., ground voltage) is applied to the source region 125b and a selection voltage is applied to the selection gate electrode 121a. An erase voltage is applied to the control gate electrode 109a, and a drain voltage is applied to the drain region 125a. The erase voltage and the drain voltage cause electrons stored in the trap insulation pattern 105a to discharge into the drain region 125a by tunneling through the tunnel insulation pattern 103a, or cause holes to combine with stored electrons by tunneling through the tunnel insulation pattern 103a from the drain region 125a. In this regard, the memory cells are erased.

In reading a non-volatile memory cell according to an embodiment of the invention, a selection voltage is applied to the selection gate electrode 121a and a sensing voltage is applied to the control gate electrode 109a. When electrons are stored within the trap insulation pattern 105a, electric current does not pass between drain/source regions 125a and 125b. When electrons are stored in the trap insulation region 105a, electronic current passes between drain/source regions 125a and 125b, and holes are stored within the trap insulation pattern 105a. Consequently, whether or not the non-volatile memory cell stores data can be checked.

The cell channel region 'c' of the non-volatile memory cell is composed of the first channel region 'a' controlled by the control gate electrode 109a and the second channel region 'b' controlled by the selection gate electrode 121a. The control gate electrode 109a and the selection gate electrode 121a are isolated from each other, and hot carrier injection occurs at the first channel region 'a'. In programming, erasing and reading of the non-volatile memory cell, only the selection voltage or the reference voltage is applied to the selection gate electrode 121a. That is, high programming voltage or erasing voltage is not applied to the selection gate electrode 121a. In a reading operation, the selection voltage applied to the selection gate electrode 121a is lower than the sensing voltage applied to the control gate electrode 109a because the thickness of the gate insulation pattern 119a on the second channel region 'b' is thinner than the sum of the thickness of the insulation patterns 103a, 105a and 107a formed between the control gate electrode 109a and the active region 102.

In a non-volatile memory cell of an exemplary embodiment of the present invention, the tunnel insulation pattern 103a, the trap insulation layer 105a and the blocking insulation pattern 107a are disposed on only a portion (the first channel region) of the cell channel region 'c'. Accordingly, erase or program voltage applied to the control gate electrode 109a may be reduced. In this regard, punch through may be reduced between drain/source regions 125a and 125b.

A non-volatile memory cell according to exemplary embodiments of the present invention has reduced power dissipation and decreased operation voltage. Additionally, a non-volatile memory cell according to exemplary embodiments of the invention is suitable for high-integration applications.

FIG. 4 through FIG. 10 are cross-sectional views showing a method of forming a non-volatile memory cell according to an exemplary embodiment of the invention.

An active region 102 (as shown in FIG. 2) is defined by forming a device isolation layer (not shown) in the semiconductor substrate 101. A tunnel insulation layer 103, a trap insulation layer 105, a blocking insulation layer 107, a first gate conductive layer 109 and a hard mask layer 111 are stacked sequentially on the semiconductor substrate 101 including the active region 102.

The tunnel insulation layer 103 may be formed of, for example, silicon oxide ($SiO_2$) or silicon oxy-nitride (SiON). The silicon oxide may be, for example, thermal oxide or CVD silicon oxide. The silicon oxynitride may be formed on the semiconductor substrate 101 including the active region by an oxynitride thermal process having $N_2O$ or NO ambient. The trap insulation layer 105 is formed of an insulation layer having a high-trap-density. For example, the trap insulation layer 105 is formed of at least one selected from the group consisting of silicon nitride, polysilicon dots layer and nitride dots layer. The silicon nitride may be CVD silicon nitride. Alternatively, the silicon nitride may be formed by performing a nitration process on the surface of the tunnel insulation layer 105. The blocking insulation layer 107 may be formed of, for example, CVD silicon oxide.

The first gate conductive layer 109 is formed of a conductive layer. For example, the first gate conductive layer may be formed of a doped polysilicon layer. The hard mask layer 111 is formed of a material layer having an etch selectivity with respect to the first gate conductive layer 109 (e.g., silicon nitride).

Figure 5:
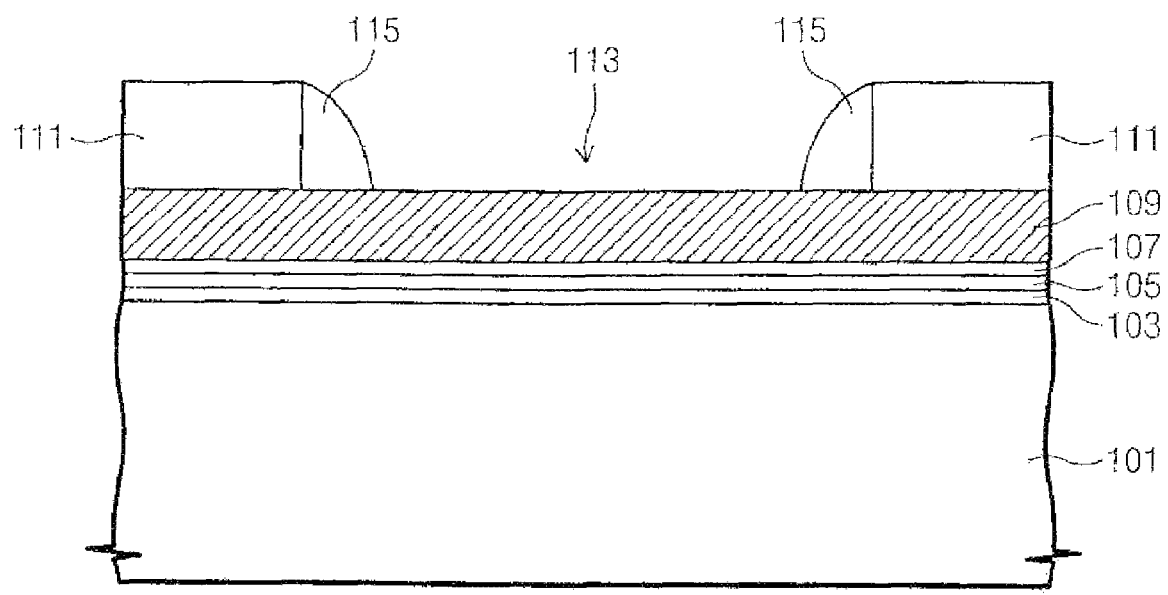

Referring to FIG. 5, a first groove 113, which exposes a predetermined region of the first gate conductive layer 109, is formed by patterning the hard mask layer 111. The first groove 113 may have a line shape crossing over the active region 102.

Spacers 115 are formed on both inner sidewalls of the first groove 113. A spacer layer (not shown) is formed conformally on the entire surface of the semiconductor substrate 101 having the first groove 113, and the spacer layer may be etched anisotropically to form the spacers 115. The spacers 115 are formed of a material layer having an etch selectivity with respect to the first gate conductive layer 109 (e.g., silicon oxide).

Figure 6:
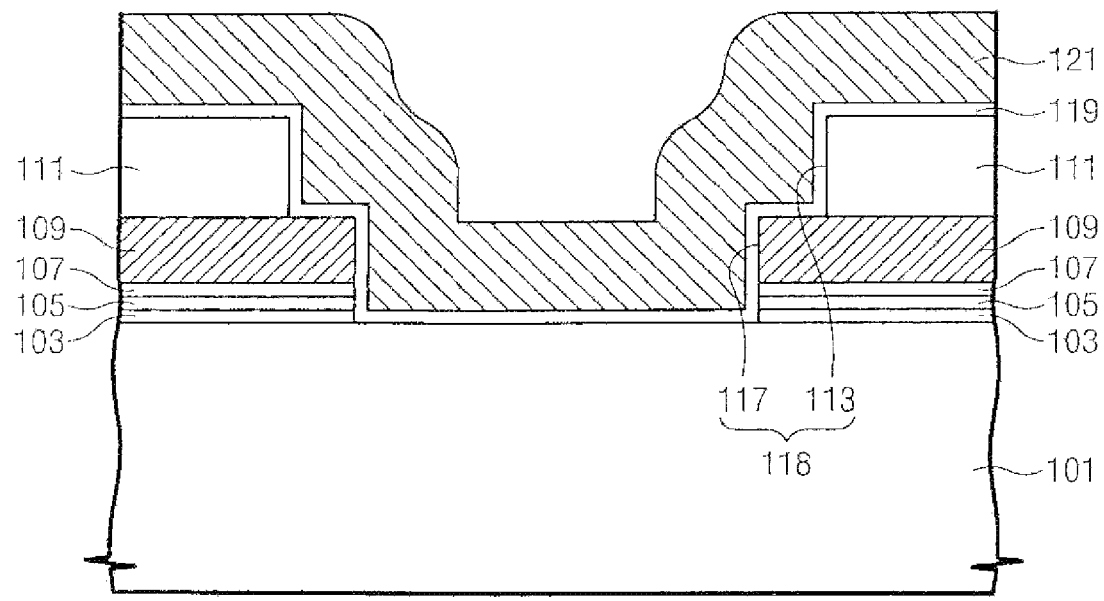

Referring to FIG. 6, using the spacers 115 and the hard mask layer 111 as etching mask, the first gate conductive layer 109, the blocking insulation layer 107, the trap insulation layer 105 and the tunnel insulation layer 103 are successively patterned by an anisotropic etching process, thereby forming a second groove that exposes the active region 102. The spacers 115 are removed to form a stepped groove 118 including the first and second grooves 113 and 117. Both sidewalls of the stepped groove 118 form a stepped shape because the insulation layers 103, 105 and 107, and the first gate conductive layer 109 protrude outwards from the hard mask layer 111. If the spacers 115 are formed of silicon oxide, a portion of the spacers may be etched when the blocking insulation layer 107 is etched. In this case, the protruding portion of the first gate conductive layer 109 may be used as a mask layer.

A gate insulation 119 is formed conformally on the entire surface of the semiconductor substrate 101 having the stepped groove 118, and a second gate conductive layer 121 is formed on the gate insulation layer 119. The gate insulation layer 119 may be formed of, for example, CVD silicon oxide. After the gate insulation layer is formed, a high temperature thermal process may be performed. The second gate conductive layer 121 may be formed of a conductive layer, such as, for example, a doped poly silicon layer.

Figure 7:
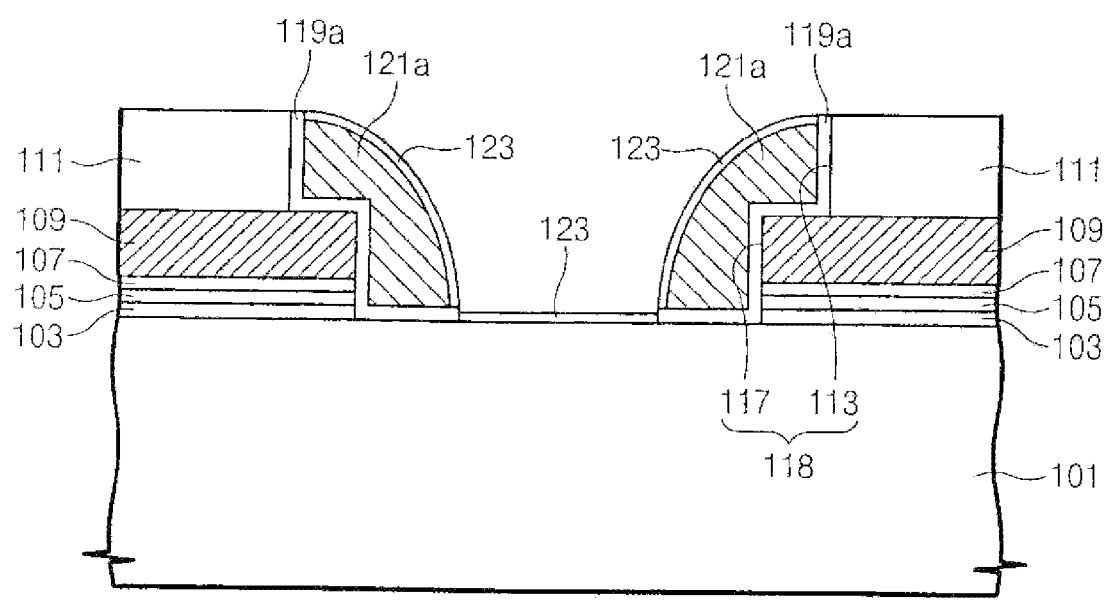

Referring to FIG. 7, the gate insulation pattern 119a and the selection gate electrode 121a stacked sequentially on inner sidewalls of the stepped groove 118, are formed by anisotropically etching the second gate conductive layer 121 and the gate insulation layer 119. The selection gate electrode 121a is formed with a spacer-shape on inner sidewalls of the stepped groove 118. The portion of the semiconductor substrate 101 between the selection gate electrodes 121a and a top surface of the hard mask layer 111 are exposed.

The selection gate electrode 121a covers a protruding sidewall and a top surface of the first gate conductive layer 109. The gate insulation pattern 119a is interposed between the selection gate electrode 121a and the semiconductor substrate 101, and between the selection gate electrode 121a and sidewalls of the stepped groove. The selection gate electrodes 121a, which are formed on lateral sidewalls of the stepped groove 118, face each other symmetrically.

Figure 8:
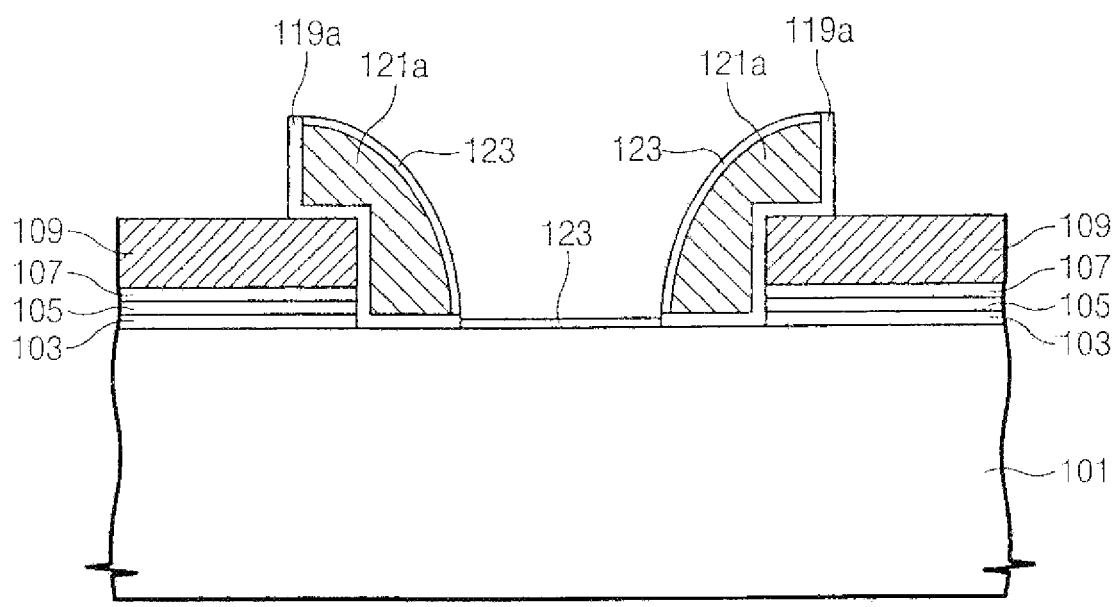
Figure 9:
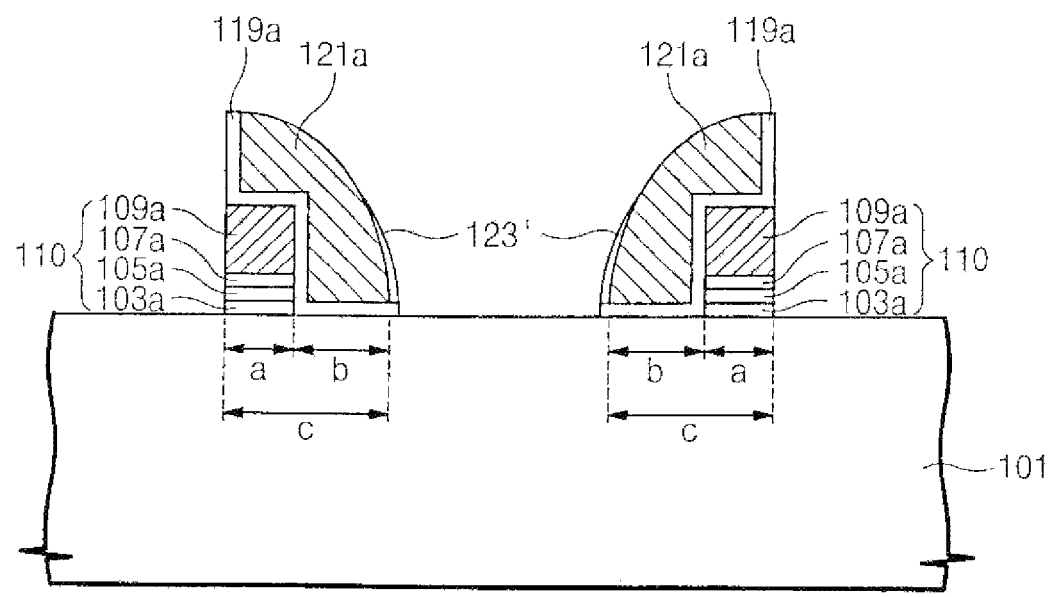

A protection layer 123 is formed on the portion of the semiconductor substrate 101 exposed between the selection gate electrodes 121a, and on curved sidewalls of selection gate electrodes 121a. The protection layer 123 is formed of a material layer having an etch selectivity with respect to the hard mask layer 111 and the first gate conductive layer 109. For example, the protection layer 123 may be formed of thermal oxide. Alternatively, the protection layer 123 may be formed of CVD silicon oxide. If the protection layer 123 is formed of CVD silicon oxide, the CVD silicon oxide is formed on the entire semiconductor substrate 101 to fill the stepped groove 118, and the deposited CVD silicon oxide is planarized until the top surface of the hard mask layer 111 is exposed. Referring to FIG. 8 and FIG. 9, the hard mask layer 111 is removed using the protection layer 123 and the gate insulation pattern 119a as an etching mask. As a result, the first conductive layer 109 is exposed. The gate insulation patterns 119a formed on sidewalls of the hard mask layer 111 protect plane sidewalls of the selection gate electrode 121a on the first conductive layer 109. Since the gate insulation patterns 119a are formed of silicon oxide, they have an etch selectivity with respect to the hard mask layer 111 and the first gate conductive layer 109.

The control gate pattern 110 is formed by anisotropically etching the first gate conductive layer 109, the blocking insulation layer 107, the trap insulation layer 105 and the tunnel insulation layer 103 successively. The control gate pattern 110 comprises a tunnel insulation pattern 103a, a trap insulation pattern 105a, a blocking insulation pattern 107a and a control gate electrode 109a, which are stacked sequentially. If the protection layer 123 is formed of the same material as that of the blocking insulation layer 107, the protection layer 123 formed on the active region 102 is etched to expose the semiconductor substrate 102 when the blocking insulation layer 107 is etched. As a result, a residual protection layer 123' is formed on a lower portion of curved sidewalls of the selection gate 121a. Also, when the blocking insulation layer 107 is etched, the gate insulation pattern 119a may also be etched partially.

If the protection layer 123 is formed of a different material layer, another process for removing the protection layer 123 may be performed.

The control gate pattern 110 forms a line shape in parallel with the selection gate electrode 121a. The control gate pattern 110 forms a protruding portion of the sidewalls of the stepped groove 118. The selection gate electrode 121a covers one sidewall and the top surface of the control gate pattern 110, and the other sidewall of the control gate pattern 110 is exposed. The control gate pattern 110 is self-aligned to the sidewall of the gate insulation pattern 119a, which is formed on the control gate pattern 110.

In exemplary embodiments of the invention, a photolithography process is not used to form the selection gate electrode 121a and the control gate pattern 110. The selection gate electrode 121a has a spacer-shape on inner sidewalls of the stepped groove 118, and the control gate pattern 110 is self-aligned with the gate insulation pattern 119a on top of the control gate pattern 110. Thus, the selection gate electrode 121a and the control gate pattern 110 may be formed smaller than the minimum line width defined by a photolithography process. Consequently, the non-volatile memory cell according to the present embodiment of the invention is suitable for high-integration.

A first channel region 'a' is defined in the active region under the control gate pattern 110 and a second channel region 'b' is defined in the active region under the selection gate electrode 119a. A cell channel region 'c' is composed of the first and second channel regions 'a' and 'b'.

Figure 10:
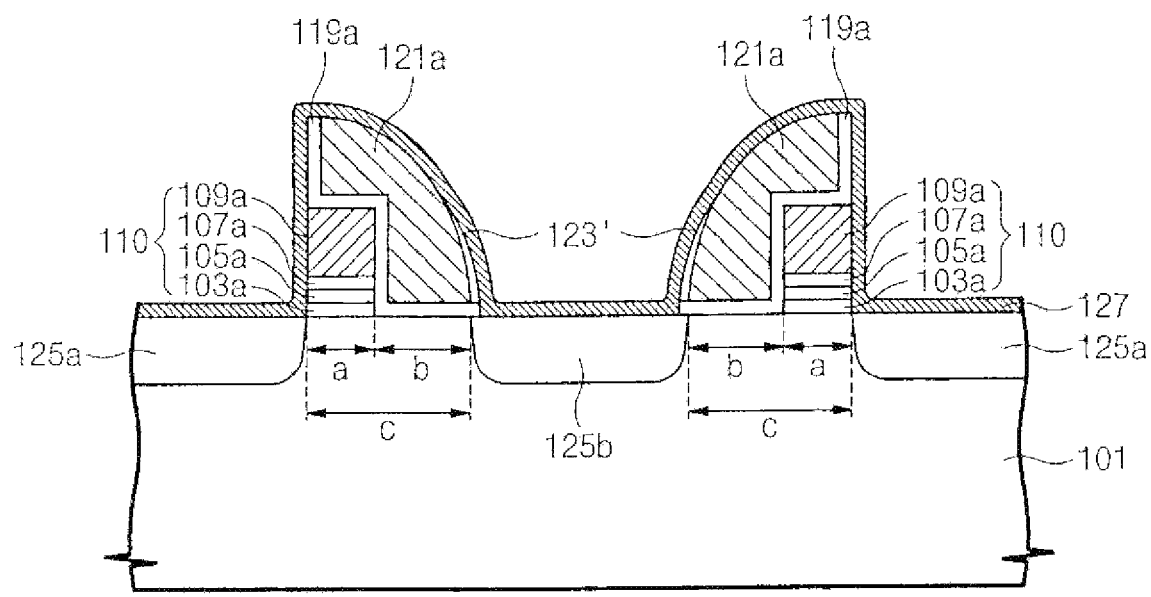

Referring to FIG. 10, impurity diffusion layers 125a and 125b are formed by implanting impurity ions selectively in the active region on both sides of the selection gate electrode 121a. The impurity diffusion layer 125a adjacent to the first channel region 'a' may be the drain region and the impurity diffusion layer 125b adjacent to the second channel region 'b' may be the source region. The drain/source regions 125a and 125b may be formed simultaneously. Alternatively, the drain/source regions 125a and 125b may be formed in sequence. A buffer insulation layer may be formed to protect the surface of the active region before implanting the impurity ions. After forming the drain/source regions 125a and 125b, the buffer insulation layer may be removed by a cleaning process. The residual protection layer 123' may be removed together with the buffer isolation layer.

Metal layer 127 is formed on the entire semiconductor substrate 101 having the drain/source regions 125a and 125b. The metal layer 127 may be formed of at least one selected form the group consisting of cobalt, nickel and titanium. Metal silicide layer 127a (as shown in FIG. 3) is formed on exposed surfaces of the drain/source regions 125a and 125b, predetermined regions on sidewalls of the selection gate electrode 121a and on sidewalls of the control gate electrode 109a by a thermal process. The non-volatile memory cell, as shown in FIG. 3, may be formed by removing the un-reacted metal layer. The metal silicide layer may be formed of, for example, cobalt silicide, titanium silicide or nickel silicide.

In a non-volatile memory cell according to another embodiment of the invention, control gate patterns share a common drain region and have exposed sidewalls facing each other.

Figure 11:
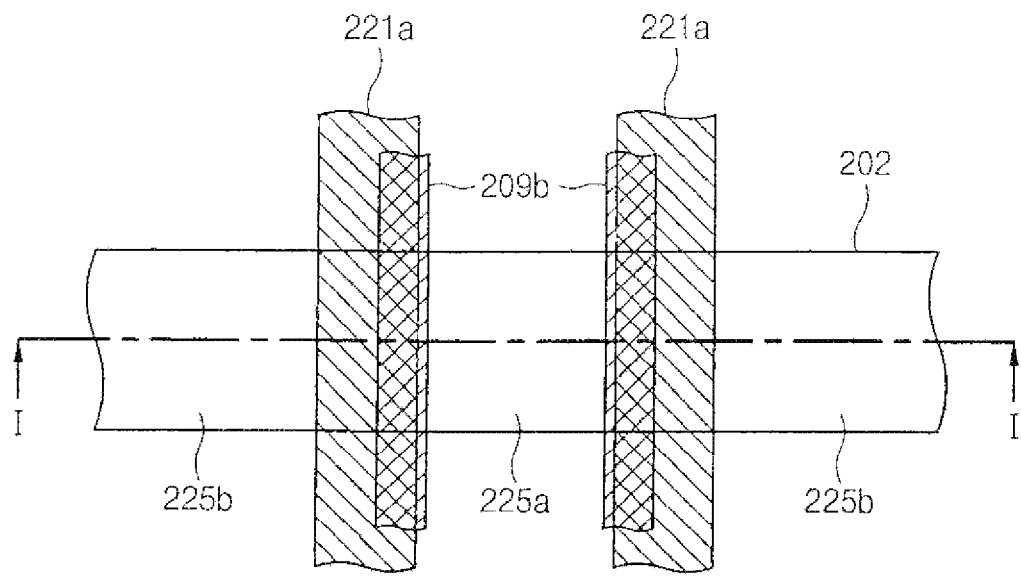
FIG. 11 is a top plan view of a non-volatile memory cell according to another embodiment of the present invention.

FIG. 11 is a top plan view showing a flowing trap-type non-volatile memory cell according to the present embodiment of the invention.

Figure 12:
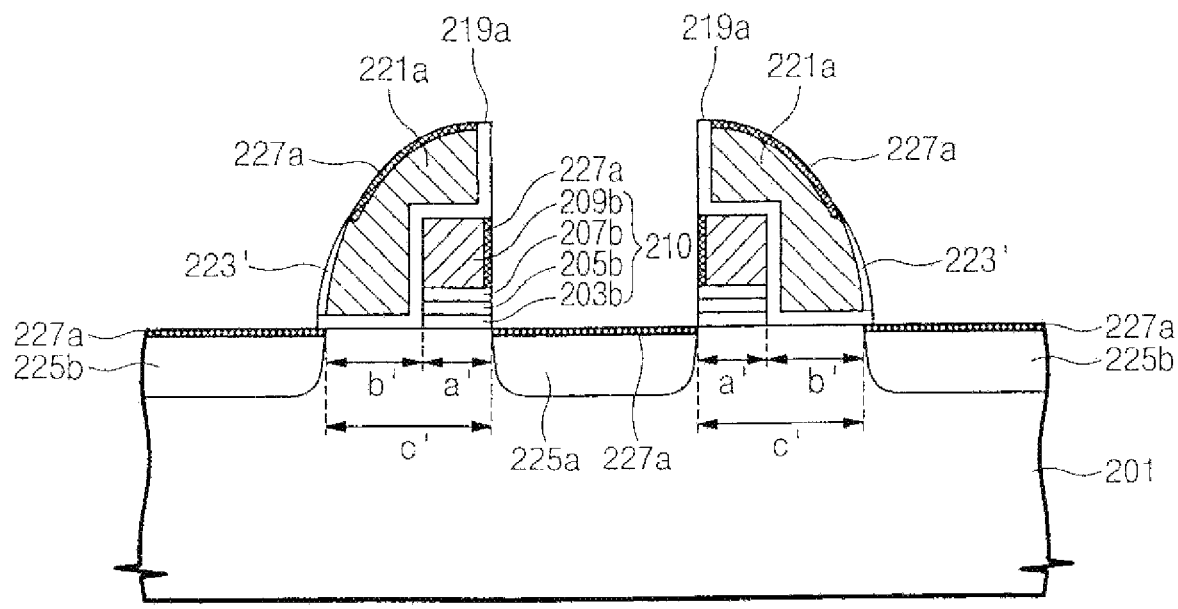
FIG. 12 is a cross-sectional view, as taken through line II-II' in FIG. 11.

FIG. 12 is a cross-sectional view, taken through line II-II' in FIG. 11.

Referring to FIG. 11 and FIG. 12, the active region 202 defined by a device isolation layer is disposed in a predetermined region of a semiconductor substrate 201. A couple of control gate patterns 210 cross over in parallel the active region 202. The control gate pattern 210 includes a tunnel insulation pattern 203b, a trap insulation pattern 205b, a blocking insulation pattern 207b and a control gate electrode 209b, which are stacked sequentially on the semiconductor substrate 201. The tunnel insulation pattern 203b may be composed of, for example, silicon oxide or silicon oxynitride. The trap insulation pattern 205b is formed of an insulation layer having a high-density trap and is used for data storage. For example, the trap insulation pattern 205b may be formed of at least one selected from the group consisting of silicon nitride, polysilicon dots layer and nitride dots layer. The blocking insulation pattern 207b prevents electric charge from flowing between the trap insulation pattern 205b and the control gate electrode 209b. The blocking insulation layer pattern 207b may be formed of, for example, silicon oxide. In a programming or an erasing operation of the non-volatile memory cell, a programming or an erasing voltage is applied to the control gate electrode 209b.

A selection gate pattern 221a crosses over the active region 202 at one side of the control gate pattern 210. The control gate electrode 221a is parallel to the control gate pattern 210. The selection gate electrode 221a may be spacer-shaped covering one sidewall and the top surface of the control gate pattern 210. The other sidewall of the control gate pattern 210 is exposed. The selection gate electrode 221a has a curved sidewall and a plane sidewall and has a concaved region at a lower portion of the plan sidewall. The control gate pattern 210 is disposed in the concaved region. Preferably, the exposed plane sidewalls of the selection gate electrodes 221a face each other.

A gate insulation pattern 219a is formed between the selection gate electrode 221a and the active region 202, and between the control gate pattern 210 and the gate insulation pattern 219a. The gate insulation pattern 219a may be elongated to cover the plan sidewall of the selection gate electrode 219a disposed on the top surface of the control gate pattern 210. Exposed sidewalls of the control gate pattern 210 and the gate insulation pattern 219a on top of the control gate pattern 210 may be disposed on the same vertical line.

A cell channel region 'c' includes a first channel region 'a' defined in the active region under the control gate electrode 209b and a second channel region 'b' defined in the active region under the selection gate electrode 221a at one side of the control gate pattern 210.

Drain region 225a is formed at one side of the cell channel region 'c' and source region 225b is formed at another side of the cell channel region 'c'. The drain region 225a is in contact with the first channel region 'a', and the source region 225b is contact with second channel region 'b'. The drain region 225a is a common drain region in contact with a couple of the first channel regions 'b'.

The thickness of the gate insulation pattern 219b is thinner than the sum of the thickness of the insulation patterns 203b, 205b and 207b interposed between the control gate electrode 209b and the active region 202.

The selection gate electrode 221a is formed of a conductive layer such as, for example, a doped polysilicon layer. The gate insulation pattern 219a may be formed of, for example, silicon oxide, such as, CVD silicon oxide or thermal hardened CVD silicon oxide. A metal silicide layer 227a may be disposed on a predetermined region of the sidewall of the selection gate electrode 221a, on the drain/source regions 225a and 225b and on an exposed sidewall of the control gate electrode 209b. The metal silicide layer 227a is formed of at least one selected from the group consisting of cobalt silicide, titanium silicide and nickel silicide.

Residual protection layer 223' may be disposed at a lower portion of the curved sidewall of the selection gate electrode 221a. The metal silicide layer 227a may be disposed on a portion of the curved sidewall of the selection gate electrode 221a in which the residual protection layer 223' is not formed. In other embodiments of the invention, the residual protection layer 223' may be omitted.

A non-volatile memory cell according to the present embodiment of the invention includes the control gate pattern 210, the selection gate electrode 221a, the gate insulation pattern 219a and the drain/source regions 225a and 225b.

In programming the non-volatile memory cell, a selection voltage is applied to the selection gate electrode 221a and a program voltage is applied to the control gate electrode 209a. A reference voltage and a drain voltage are applied to the source region 225b and the drain region 225a, respectively. In erasing the non-volatile memory cell, a reference voltage is applied to the source region 225b and the selection gate electrode 221a and a drain voltage and an erasing voltage are applied respectively to the drain region 225a and the control gate electrode 209a. In reading the non-volatile memory cell, after the selection voltage and sensing voltage are applied to the selection gate electrode 221a and the control gate electrode 209a, respectively, a predetermined voltage is applied between drain/source regions 225a and 225b.

The selection gate electrode 221a and the control gate electrode 209b are electronically isolated from each other. Accordingly, different voltages are applied to the selection gate electrode 221a and the control gate electrode 209a. Low voltage may be applied to the selection gate electrode 221a as compared to that applied to the control gate electrode 209a. In addition, erasing or programming voltages applied to the control gate electrode 209b may be decreased since channel length is shortened under the insulation patterns 203b, 205b and 207b. Thus, punch through between drain/source regions 225a and 225b may be diminished.

FIG. 13 through FIG. 17 are cross-sectional views showing a method for forming a non-volatile memory device according to another embodiment of the present invention.

Figure 13:
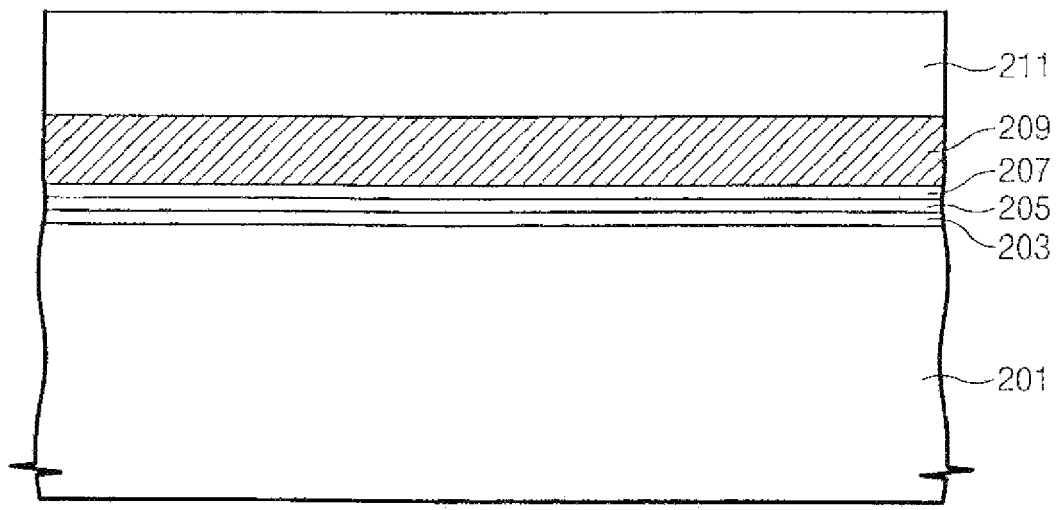
FIG. 13 through FIG. 17 are cross-sectional views showing a method of forming a non-volatile memory cell according to another embodiment of the present invention.

A device isolation layer is formed in the semiconductor substrate 201 to define the active region 202 (as shown in FIG. 11). Referring to FIG. 13, a tunnel insulation layer 203, a trap insulation layer 205, a blocking insulation layer 207, a first gate conductive layer 209 and a hard mask layer 211 are formed sequentially on the semiconductor substrate 201 including the active region 202. The tunnel insulation layer 203 may be formed of, for example, thermal oxide, CVD silicon oxide or silicon oxynitride. If the tunnel insulation layer 203 is formed of silicon oxynitride, the tunnel insulation layer 203 may be formed by a thermal process with $N_2O$ or NO ambient. The trap insulation layer 205 may be formed of high-density insulation layers, such as, for example, a silicon nitride layer, a polysilicon dots layer and a nitride dots layer. The silicon nitride may be CVD silicon nitride. The blocking insulation layer 207 may be formed of, for example, CVD silicon oxide.

The first gate conductive layer 209 may be formed of a conductive layer, such as, for example, a doped polysilicon layer. The hard mask layer 211 is formed of a material layer having an etch selectivity with respect to the first gate conductive layer 209, such as, for example, silicon nitride.

Figure 14:
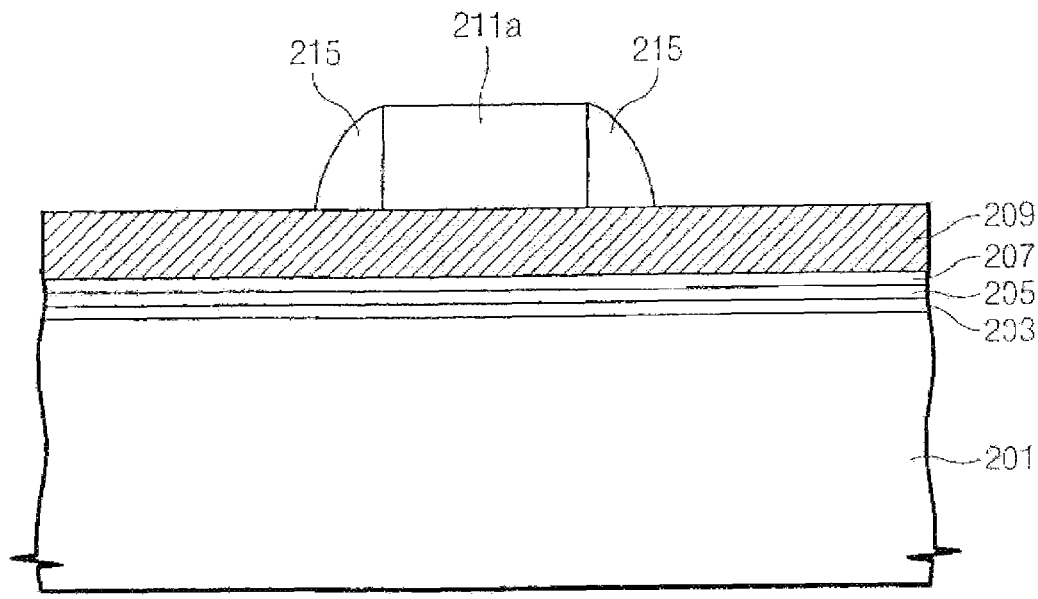
Figure 15:
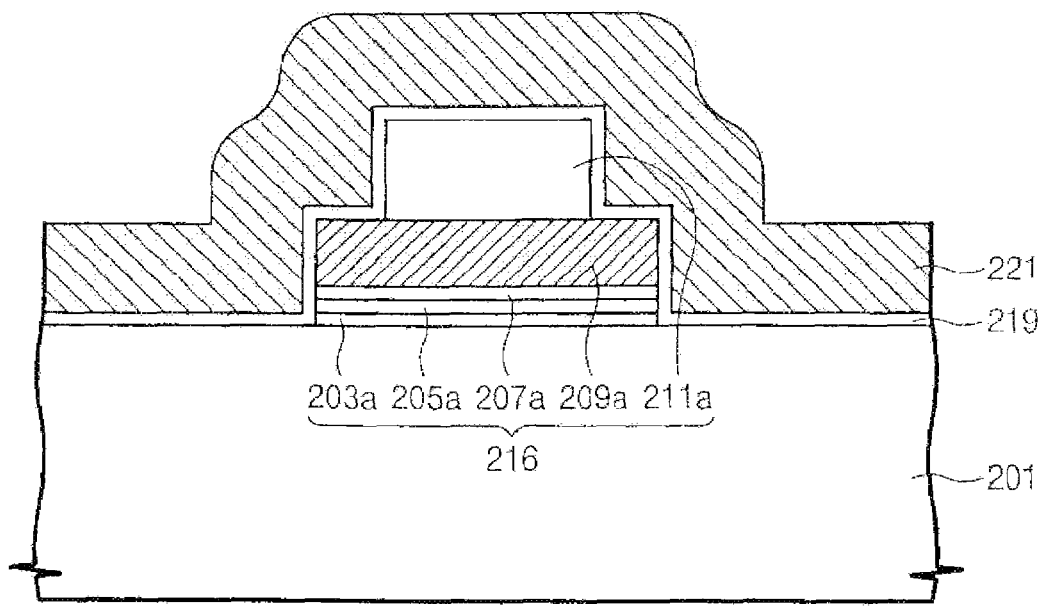

Referring to FIG. 14 and FIG. 15, a hard mask pattern 211a, which as a line-shape crossing over the active region, is formed by patterning the hard mask layer 211. Spacers 215 are formed on both sidewalls of the hard mask pattern 211a. The spacers 215 are formed of a material layer having an etch selectivity with respect to the first gate conductive layer 209, such as, for example, a silicon oxide layer.

A line pattern 216 is formed using the hard mask pattern 211a and the spacers 215 as etching mask by patterning the first gate conductive layer 209, the blocking insulation layer 207, the trap insulation layer and the tunnel insulation layer 203 sequentially. The line pattern 216 comprises preliminary tunnel insulation pattern 203a, preliminary trap insulation pattern 205a, preliminary blocking insulation pattern 207a, a first gate conductive pattern 209a and the hard mask pattern 211a, which are stacked sequentially. Portions of the line pattern 216 protrude from the sides of the hard mask pattern 211a. The protrusion of the line pattern 216 includes the first gate conductive pattern 209a, the preliminary blocking insulation pattern 207a, the preliminary trap insulation pattern 205a and the tunnel insulation pattern 203a. The sidewalls of the line pattern 216 are step-shaped.

The spacers 215 are removed. If the spacers 215 are formed of silicon oxide, a part of the spacers 215 may be etched when the blocking insulation layer 207 is etched. In this case, the first gate conductive layer pattern 209a may act as an etching mask.

The gate insulation layer 219 is formed conformally on the entire surface of the semiconductor substrate 201 having the line pattern 216. The gate insulation layer 219 may be formed of, for example, CVD silicon oxide. A thermal process at a high temperature may be performed after CVD silicon oxide is deposited on the gate insulation layer 218.

The second conductive layer 221 is formed on the gate insulation layer 219. The second gate conductive layer 221 may be formed of a conductive layer, such as, for example, a doped polysilicon layer.

Figure 16:
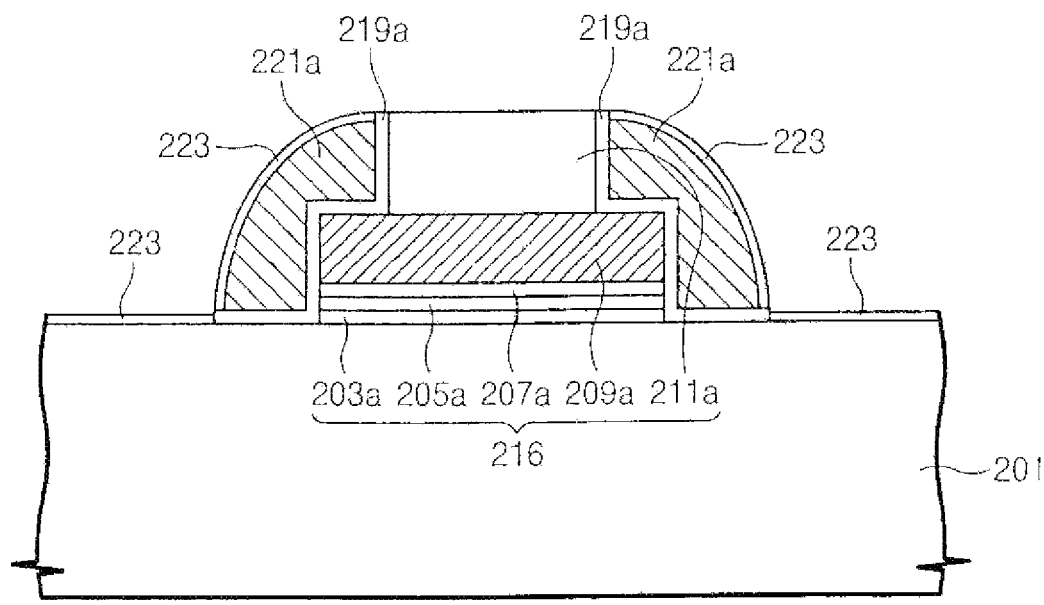
Figure 17:
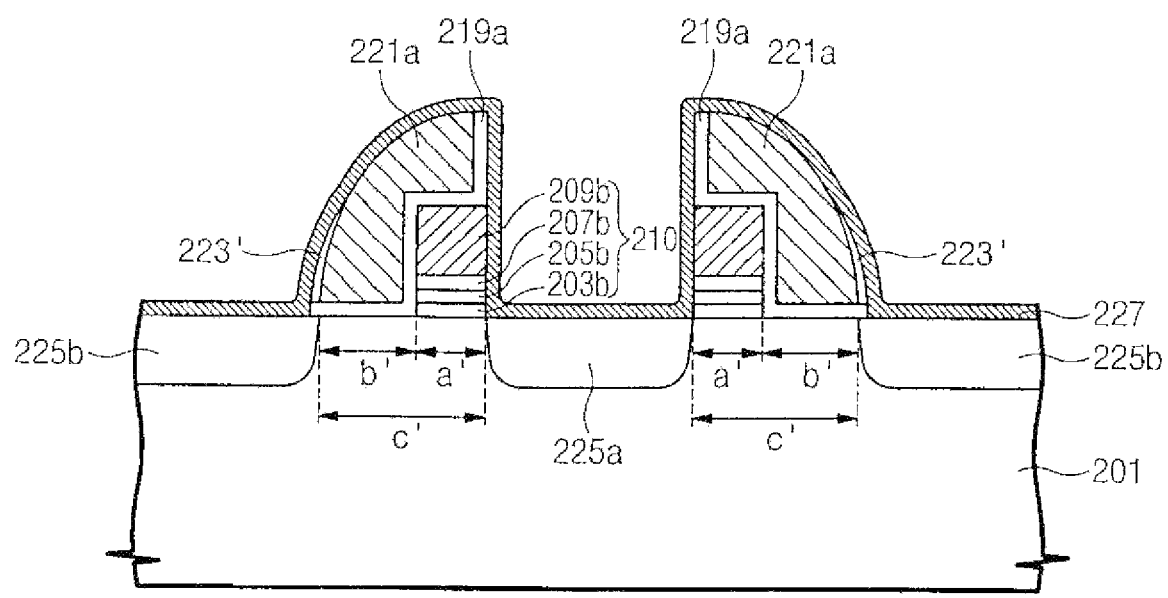

Referring to FIG. 16 and FIG. 17, the entire surface of the second gate conductive layer 221 and the gate insulation layer 219 are anisotropically etched to form the selection gate electrode 221a and the gate insulation pattern 219a. The selection gate electrode 221a has a spacer-shape and covers protruding portions of the line pattern 216. The gate insulation pattern 219a is interposed between the selection gate electrode 221a and the semiconductor substrate 201, and between the selection gate electrode 221a and the sidewall of the line pattern 216. A portion of the active region 202 at one side of the selection gate electrode 221a and the top surface of the hard mask pattern 211a are exposed. A couple of selection gate electrodes 221a, each formed on a respective sidewall of the line pattern 216, cross over the active region in parallel and have a symmetric structure.

A protection layer 223 is formed on curved sidewalls of the selection gate electrode 221a and exposed portions of the active region 202. The protection layer 223 is formed of a material layer having an etching selectivity with respect to the hard mask pattern 221a and the first gate conductive layer 209a. For example, the protection layer 223 may be formed of thermal oxide.

The hard mask pattern 211 is removed by using the protection layer 223 and the gate insulation pattern 219a as an etching mask. Accordingly, the first gate conductive pattern 209a under the hard mask pattern 211a is exposed. The control gate pattern 210 is formed by anisotropically etching the exposed first gate conductive pattern 209a, the preliminary blocking insulation pattern 207a, the preliminary trap insulation pattern 205a and the preliminary tunnel insulation pattern 207a successively. The control gate pattern 210 is self-aligned to the sidewalls of the gate insulation pattern 219a on the control gate pattern 210. The self-aligned sidewall of the control gate pattern 210 is exposed. The control gate pattern 210 comprises a tunnel insulation pattern 203b, a trap insulation pattern 205b, a blocking insulation pattern 207b and a control gate electrode 209b stacked sequentially. The control gate pattern 210 has a line-shape, is parallel to the selection gate electrode 221a and crosses over the top portion of the active region 202. The protruding portion of the line pattern 216 forms the control gate pattern 210. The selection gate electrode 221a covers one sidewall and the top surface of the control gate pattern 210.

The protection layer 223 and the gate insulation pattern 219a over the control gate pattern 210 may be etched when the preliminary blocking insulation pattern 207a is etched. Accordingly, the semiconductor substrate 201 under the protection layer 223 may be exposed. In this case, residual protection layer 223' may be formed at a lower portion of the curved sidewall of the selection gate electrode. If the protection layer 223 has a different etching rate as compared with the preliminary blocking insulation pattern 207a, another process can be used to remove protection layer 223.

Cell channel regions 'c' include a first channel region 'a' defined in the active region under the control gate electrode 209b and a second channel region 'b' defined in the active region under the selection gate electrode 221a at one side of the control gate electrode 209b.

Drain/source regions 225a and 225b are formed by selectively implanting impurity ions in the active region 202 at both sides of the cell channel regions 'c'. The drain region 225a may be in contact with the first channel region 'a' and the source region 225b may be in contact with the second channel region 'b'. The drain/source regions 225a and 225b may be formed simultaneously. Alternatively, the drain/source regions 225a and 225 b may be formed sequentially. A buffer insulation layer (not shown) may be formed before implanting impurity ions. After forming the drain/source regions 225a and 225b, the buffer insulation layer may be removed by a cleaning process.

A metal layer 127 is formed on the entire semiconductor substrate 201 including the drain/source regions 225a and 225b. The metal layer 127 may be formed of at least one selected from the group consisting of cobalt, nickel and titanium.

A metal silicide layer (see 227a in FIG. 12) is formed on the drain/source regions 225a and 225b, on predetermined regions on the sidewalls of the selection gate electrode 221a and on exposed sidewalls of the control gate electrode 209b by a thermal process. The non-volatile memory cell shown in FIG. 11 may be formed by removing the non-reacted metal layer.

As previously mentioned, a photolithography process is not required to form the selection gate electrode 221a and the control gate pattern 210. The selection gate electrode 221a is has a spacer-shape and the control gate pattern 210 is self-aligned by the selection gate electrode 221a and the gate insulation pattern 219a. The selection gate electrode 221a and the control gate pattern 110 may be formed smaller than the minimum line width as defined by a photolithography process. Consequently, the non-volatile memory cell according to the present embodiment of the invention is suitable to high-integration.

In the non-volatile memory cell according to various exemplary embodiments of the invention, cell channel regions include a first channel region controlled by a control gate electrode and a second channel region controlled by a selection gate electrode. The thickness of the gate insulation pattern on the first channel region is thinner than the sum of the thickness of the insulation patterns (the tunnel insulation pattern, the trap insulation pattern, and the blocking insulation pattern) on the second channel region. Accordingly, high programming voltage or erasing voltage are not applied to the selection gate electrode or the control gate electrode. Consequently, power dissipation and punch through can be reduced. Also, because the control gate electrode and the selection gate electrode are self-aligned, they can be formed smaller than the minimum line width as defined by a photolithography process.

While the present invention has been described in connection with specific and exemplary embodiments thereof, it is capable of various changes and modifications without departing from the spirit and scope of the invention. It should be appreciated that the scope of the invention is not limited to the detailed description of the invention hereinabove, which is intended merely to be illustrative, but rather comprehends the subject matter defined by the following claims. In addition, it should be construed to include all methods and devices that are in accordance with the claims.

What is claimed is:

1. A method of fabricating a non-volatile memory cell comprising the steps of:

forming a tunnel insulation layer, a trap insulation layer, a blocking insulation layer, a first gate conductive layer and a hard mask layer sequentially on a semiconductor substrate;

forming a stepped groove exposing a predetermined region of the semiconductor substrate by patterning the hard mask layer, the first gate conductive layer, the blocking insulation layer, the trap insulation layer, and the tunnel insulation layer successively, wherein the tunnel insulation layer, the trap insulation layer, the blocking insulation layer and the first gate conductive layer form protruding portions of the stepped groove;

forming a spacer-shaped selection gate electrode covering protruding portions of stepped groove and a gate insulation pattern, which is interposed between the selection gate electrode and an inner sidewall of the stepped groove, and between the selection electrode and the semiconductor substrate; and forming a control gate pattern having a sidewall that is self-aligned with a sidewall of the gate insulation pattern, wherein the control gate pattern comprises the tunnel insulation layer, the trap insulation layer, the blocking insulation pattern and the control gate electrode which are stacked sequentially.

2. The method of fabricating a non-volatile memory cell according to claim 1, wherein the tunnel insulation layer is formed of at least one selected from the group consisting of silicon oxide and silicon oxynitride.

3. The method of fabricating a non-volatile memory cell according to claim 1, wherein the trap insulation layer is formed of at least one selected from the group consisting of silicon nitride, polysilicon dots and nitride dots.

4. The method of fabricating a non-volatile memory cell according to claim 1, wherein the step of forming the stepped groove comprises the steps of;

forming a first groove, which exposes a predetermined region of the first gate conductive layer by patterning the hard mask layer;

forming spacers which have an etch selectivity with respect to the first gate conductive layer on sidewalls of the first groove;

forming a second groove, using the hard mask layer and the spacers as an etching mask, exposing a predetermined region of the semiconductor substrate by aniostropic etching successively the blocking insulation layer, the trap insulation layer and the tunnel insulation layer; and removing the spacers, wherein the stepped groove comprises the first and second grooves.

5. The method of fabricating a non-volatile memory cell according to claim 1, wherein the step of forming a selection gate electrode and a gate insulation pattern comprises the steps of:

forming a gate insulation layer over the entire semiconductor substrate including the stepped groove;

forming a second gate conductive layer over the gate insulation layer; and anisotropically etching successively the second gate conductive layer and the gate insulation layer.

6. The method of fabricating a non-volatile memory cell according to claim 1, wherein the step of forming a control gate pattern comprises the steps of:

forming a protection layer over an exposed surface of the semiconductor substrate and on a curved sidewall of the selection gate electrode; and anisotropically etching the hard mask layer, the first gate conductive layer, the blocking insulation layer, the trap insulation layer and the tunnel insulation layer using the protection layer and the gate insulation pattern as an etch mask, wherein the protection layer is formed of a material layer having an etch selectivity with respect to the hard mask layer and the first gate conductive layer; and wherein the control gate pattern is equivalent to the protruding portion of the stepped groove.

7. The method of fabricating a non-volatile memory cell according to claim 6, wherein the protection layer is formed of thermal oxide.

8. The method of fabricating a non-volatile memory cell according to claim 1, further comprising a step of forming impurity diffusion layers by selectively implanting impurity ions in the semiconductor substrate at sides of the selection gate electrode.

9. The method of fabricating a non-volatile memory cell according to claim 8, further comprising a step of forming a metal silicide layer on predetermined regions of the impurity diffusion layers, predetermined regions of a sidewall of the selection gate electrode and the self-aligned sidewall of the control gate electrode.

10. A method of fabricating a non-volatile memory cell according to claim 1, wherein the protruding portions protrude beyond a side edge of the hard mask layer.

11. A method of fabricating a non-volatile memory cell comprising the steps of:

forming a tunnel insulation layer, a trap insulation layer, a blocking insulation layer, a first gate conductive layer and a hard mask layer sequentially over a semiconductor substrate;

forming a line pattern composed of a preliminary tunnel insulation pattern, a preliminary trap insulation pattern, a preliminary blocking insulation pattern, a first gate electrode pattern and a hard mask pattern which are stacked by successively patterning the hard mask layer, and the first conductive layer, the blocking insulation layer, the trap insulation layer and the tunnel insulation layer, wherein the first gate conductive pattern, the preliminary blocking insulation pattern, the preliminary trap insulation pattern and the preliminary tunnel insulation pattern form protruding portions of the line pattern;

forming a spacer-shaped selection gate electrode covering the protruding portion of the line pattern, and a gate insulation pattern interposed between the selection gate electrode and the line pattern, and between the selection gate electrode and the semiconductor substrate; and forming a control gate pattern having a sidewall self-aligned with the gate insulation pattern, wherein the control gate pattern comprises a tunnel insulation pattern, a trap insulation pattern, a blocking insulation pattern and a control gate pattern, which are stacked.

12. The method of fabricating a non-volatile memory cell according to claim 11, wherein the tunnel insulation layer is formed of at least one selected form the group consisting of silicon oxide, silicon oxynitride.

13. The method of fabricating a non-volatile memory cell according to claim 11, wherein the trap insulation layer is formed of at least one selected from the group consisting of silicon nitride, polysilicon and nitride dots.

14. The method of fabricating a non-volatile memory cell according to claim 11, wherein the step of forming a line pattern comprises the steps of:

forming the hard mask pattern line-shaped by patterning the hard mask layer on the first gate conductive layer;

forming spacers having a etch selectivity with respect to the first conductive layer on sidewalls of the hard mask pattern;

forming a preliminary tunnel insulation pattern, a preliminary trap insulation pattern, a preliminary blocking insulation pattern and a first gate conductive pattern by anisotropically etching the first gate conductive layer, the blocking insulation layer, the trap insulation layer and the tunnel insulation layer using the hard mask and the spacers as an etch mask; and removing the spacers, wherein the line pattern comprises the preliminary tunnel insulation pattern, the preliminary trap insulation pattern, the preliminary blocking insulation pattern, the first conductive layer and the hard mask pattern.

15. The method of fabricating a non-volatile memory cell according to claim 11, wherein the step of forming a selection gate electrode and a gate insulation pattern comprises the steps of:

forming a gate insulation layer conformally on the entire semiconductor substrate including the line pattern;

forming a second gate conductive layer on the gate insulation layer; and anisotropically etching the second conductive layer and the gate insulation.

16. The method of fabricating a non-volatile memory cell according to claim 11, wherein the step of forming the control gate pattern comprising the steps of:

forming a protection layer over an exposed surface of the semiconductor substrate and on a curved sidewall of the selection gate electrode; and ansiotropically etching the hard mask pattern, the first gate conductive pattern, the preliminary blocking insulation pattern, the preliminary trap insulation pattern and the preliminary tunnel insulation pattern using the protection layer and the gate insulation pattern as an etch mask, wherein the protection layer is formed of a material layer having etching selectivity with respect to the hard mask layer and the first gate conductive layer, and wherein the control gate pattern is equivalent to the protruding portion of the line pattern.

17. The method of fabricating a non-volatile memory cell according to claim 16, wherein the protection layer is formed of thermal oxide.

18. The method of fabricating a non-volatile memory cell according to claim 11, further comprising a step of forming impurity diffusion layers by selectively implanting impurity ions in the semiconductor substrate at sides of the selection gate electrode.

19. The method of fabricating a non-volatile memory cell according to claim 18, further comprising a step of forming a metal silicide layer on a predetermined region of the impurity diffusion layer, a predetermined region of a sidewall of the selection gate electrode and the self-aligned sidewall of the control gate electrode.

20. A method of fabricating a non-volatile memory cell according to claim 11, wherein the protruding portions protrude beyond a side edge of the hard mask pattern.

* * * * *